United States Patent
Caldwell et al.

(10) Patent No.: US 7,720,878 B2
(45) Date of Patent: *May 18, 2010

(54) DATA COMPRESSION METHOD AND APPARATUS

(76) Inventors: Donald F Caldwell, 526 Trinity Pl., Westfield, Union County, NJ (US) 07090; Kenneth Ward Church, 185 Jockey Hollow Rd., Bernardsville, Somerset County, NJ (US) 07924; Glenn Stephen Fowler, 2322 Lyde Pl., Scotch Plains, Union County, NJ (US) 07076

( * ) Notice: Subject to any disclaimer, the term of this patent is extended or adjusted under 35 U.S.C. 154(b) by 975 days.

This patent is subject to a terminal disclaimer.

(21) Appl. No.: 11/110,554

(22) Filed: Apr. 20, 2005

(65) Prior Publication Data
US 2005/0192994 A1 Sep. 1, 2005

Related U.S. Application Data

(63) Continuation of application No. 09/383,889, filed on Aug. 26, 1999, now Pat. No. 6,959,300.

(60) Provisional application No. 60/111,781, filed on Dec. 10, 1998.

(51) Int. Cl.
G06F 17/30 (2006.01)
(52) U.S. Cl. ...................................................... 707/803
(58) Field of Classification Search ................ 707/100, 707/101
See application file for complete search history.

(56) References Cited

U.S. PATENT DOCUMENTS

| | | | | |
|---|---|---|---|---|
| 5,448,733 A | * | 9/1995 | Satoh et al. | 707/2 |
| 6,012,062 A | * | 1/2000 | Jagadish et al. | 707/101 |
| 6,014,671 A | * | 1/2000 | Castelli et al. | 707/101 |
| 6,092,071 A | * | 7/2000 | Bolan et al. | 707/101 |
| 6,216,213 B1 | * | 4/2001 | Breternitz et al. | 711/170 |
| 6,959,300 B1 | * | 10/2005 | Caldwell et al. | 707/101 |

OTHER PUBLICATIONS

Houlding et al., Low Entropy Image Pyramids for Efficient Lossless Coding, Aug. 1995, Image Processing IEEE Transactions, vol. 4 Issue 8, p. 1150-1153.*
Lekatsas et al., Code Compression for Embedded Systems, Jun. 1998, Design Automation Conf., 1998 Proceddings, p. 516-521.*

* cited by examiner

Primary Examiner—Greta L Robinson

(57) ABSTRACT

An improved data compression method and apparatus is provided, particularly with regard to the compression of data in tabular form such as database records. The present invention achieves improved compression ratios by utilizing metadata to transform the data in a manner that optimizes known compression techniques. In one embodiment of the invention, a schema is generated which is utilized to reorder and partition the data into low entropy and high entropy portions which are separately compressed by conventional compression methods. The high entropy portion is further reordered and partitioned to take advantage of row and column dependencies in the data. The present invention enables not only much greater compression ratios but increased speed than is achieved by compressing the untransformed data.

2 Claims, 8 Drawing Sheets

```
read partition file
write header containing {
      pzip  identification magic
      induced partition
}
while data remains {
      read window buffer
      for each partition class {
            copy columns to internal buffer
            gzip internal buffer
            write compressed buffer
      }
}
```

Figure 4

```
/* open output file stream */
op = sfopen(0, "output.pz", "w");
/* push gzip compress discipline */
sfdcgzip(op, SFGZ_NOCRC);
/* write pzip header and partition */
sfwrite(op, header, header_size);
sfsync(op);
/* loop through all windows */
while (parts = read_window(ip, buf))
{
        /* output window size */
        sfputu(op, parts->winsize);
        /* output each partition class */
        for (i = 0; i < parts->classes; i++)
                sfwrite(op, parts->pclass[i],
                        parts->psize[i]);
        sfsync(op);
        /* write DIFE low frequency data */
        . . .
}
```

Figure 5

```
for (;;)
{
        /* read number of pattern copies */
        number_copies = sfgetu(ip)
        do
        {
                /* initialize output record
                   with low frequency columns */
                memcpy(buf, pat, record_size);
                /* add in high frequency columns */
                for (i = 0; i < high_freq_cols; i++)
                {
                        buf[map[i]] = *mix[i];
                        mix[i] += inc[i];
                }
                /* write the record */
                sfwrite(op, buf, record_size);
        } while (--number_copies > 0);
        /* get next pattern column
           offset+1 that changes */
        column = sfgetu(ip)
        /* 0 means window is done */
        if (column == 0)
                return 0;
        for (;;)
        {
                /* install the new value */
                pat[column - 1] = *val++
                /* get next offset+1 */
                column = sfgetu(ip);
                /* 0 means changes are done */
                if (column == 0)
                        return 0;
        }
}
```

Figure 6

```
HEADER
{
    magic number   for identification
    record size
    max records per window
    column permutation
    number high frequency columns
    high frequency partition classes
}
WINDOW   one or more windows
{
    number records in window
    0  if no more windows
    HIGH FREQUENCY DATA
    {
        class 0
         . . .
        class p+1
    }
    LOW FREQUENCY DATA
    {
        number of DIFE values
        DIFE pattern record
        DIFE values
        DIFE DATA   one or more
        {
            repetition count
            0  if no more data
            COLUMN CHANGE LIST
            {
            column offset+1
            0  if end of list
            }
        }
    }
}
```

Figure 7

```
record size: 752
field1:  748 82 734 81 749-750 78 747 744-746 79-80 743 77 733
field2:  225 224 222-223 226-232 119 233 117-118 422 236
field3:  450 424 96 62 95 61 449
field4:  125-126 124 123 121 120 122
field5:  331 330
field6:  166 159-160 167 164
field7:  138 555 554 137 560 157 271 270
field8:  423 320 319 178 564 316
field9:  107-108 106
field10: 163 165 158
field11: 63
field12: 66
field13: 67-68
field14: 69
field15: 70
field16: 71
field17: 161-162
field18: otherwise.
```

DATA COMPRESSION METHOD AND APPARATUS

CROSS REFERENCE TO RELATED APPLICATIONS

This is a continuation of U.S. Patent application Ser. No. 09/383,889, filed Aug. 26, 1999 now U.S. Pat. No. 6,959,300. This application also claims priority to Provisional Application Serial No. 60/111,781, filed on Dec. 10, 1998, the contents of which are incorporated by reference herein.

FIELD OF THE INVENTION

The present invention relates to data compression systems and methods.

BACKGROUND OF THE INVENTION

Data compression systems, which encode a digital data stream into compressed digital code signals and which decode the compressed digital code signals back into the original data, are known in the prior art. The methods utilized in data compression systems serve to reduce the amount of storage space required to hold the digital information and/or result in a savings in the amount of time required to transmit a given amount of information. For example, the extensive transactional records accounted for by companies such as banks and telephone companies are often stored for archival purposes in massive computer databases. This storage space is conserved, resulting in a significant monetary savings, if the data is compressed prior to storage and decompressed from the stored compressed files for later use.

Various methods and systems are known in the art for compressing and subsequently reconstituting data. For example, a compression scheme used pervasively on the Internet today is "gzip," designed by Jean-Loup Gailly. See "DEFLATE Compressed Data Format Specification version 1.3", RFC 1951, Network Working Group May 1996; "GZIP file format specification version 4.3," RFC 1952, Network Working Group, May 1996. Gzip utilizes a variation of the well-known LZ77 (Lempel-Ziv 1977) compression technique which replaces duplicated strings of bytes within a frame of a pre-defined distance with a pointer to the original string. Gzip also uses Huffman coding on the block of bytes and stores the Huffman code tree with the compressed data block. Gzip normally achieves a compression ratio of about 2:1 or 3:1, the compression ratio being the size of the clear text relative to the size of the compressed text.

Gzip is a popular but suboptimal compression scheme. Nevertheless, the inventors, while conducting experiments on compressing massive data sets of telephone call detail records, managed to achieve compression ratios of around 15:1 when using gzip. The substantial reduction in size effected by merely using a conventional compression technique such as gzip suggested to the inventors that additional improvements to the compression ratio could be devised by a careful analysis of the structure of the data itself.

SUMMARY OF THE INVENTION

It is an object of the invention to provide an improved data compression method and apparatus, particularly with regard to the compression of data in tabular form such as database records. The present invention achieves improved compression ratios by utilizing metadata to transform the data in a manner that optimizes known compression techniques. The metadata not only leads to better compression results, it can be maintained by an automatic procedure. In one embodiment of the invention, a schema is generated which is utilized to reorder and partition the data into low entropy and high entropy portions which are separately compressed by conventional compression methods. The high entropy portion is further reordered and partitioned to take advantage of row and column dependencies in the data. The present invention takes advantage of the fact that some fields have more information than others, and some interactions among fields are important, but most are not. Parsimony dictates that unless the interactions are important, it is generally better to model the first order effects and ignore the higher order interactions. Through the proper analysis of such interactions, the present invention enables improvements in both space and time over conventional compression techniques.

BRIEF DESCRIPTION OF THE DRAWINGS

FIGS. 3A and 3B sets forth an illustration of difference encoding (DIFE).

FIG. 4 sets forth pseudocode of a design for the PZIP compressor in accordance with an embodiment of the present invention.

FIG. 5 sets forth programming code from the PZIP compressor in accordance with an embodiment of the present invention.

FIG. 6 sets forth programming code from the PZIP decompressor in accordance with an embodiment of the present invention.

FIG. 7 sets forth an illustration of the data layout of PZIP.

FIG. 8 is a example of an induced schema partition file in accordance with an embodiment of the present invention.

DETAILED DESCRIPTION

Figure 1A:
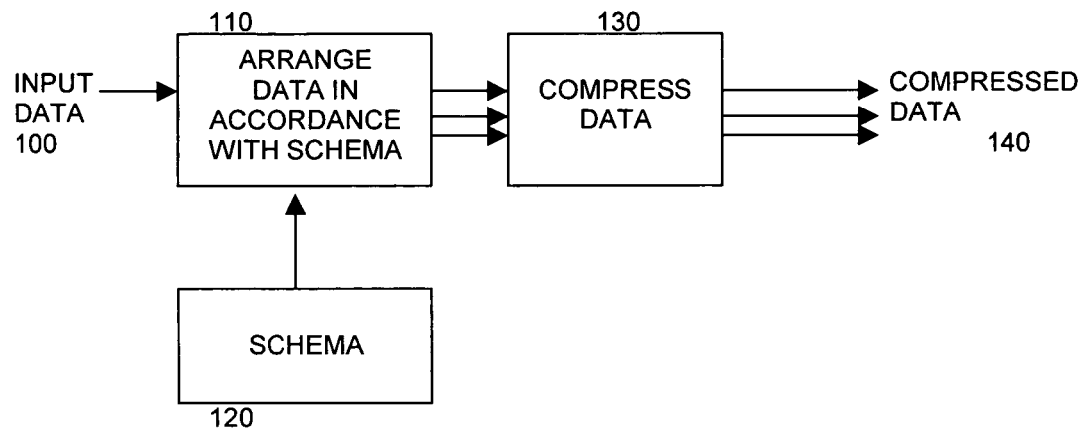
FIGS. 1A and 1B are block diagrams of a compression system in accordance with an embodiment of the present invention.
Figure 1B:
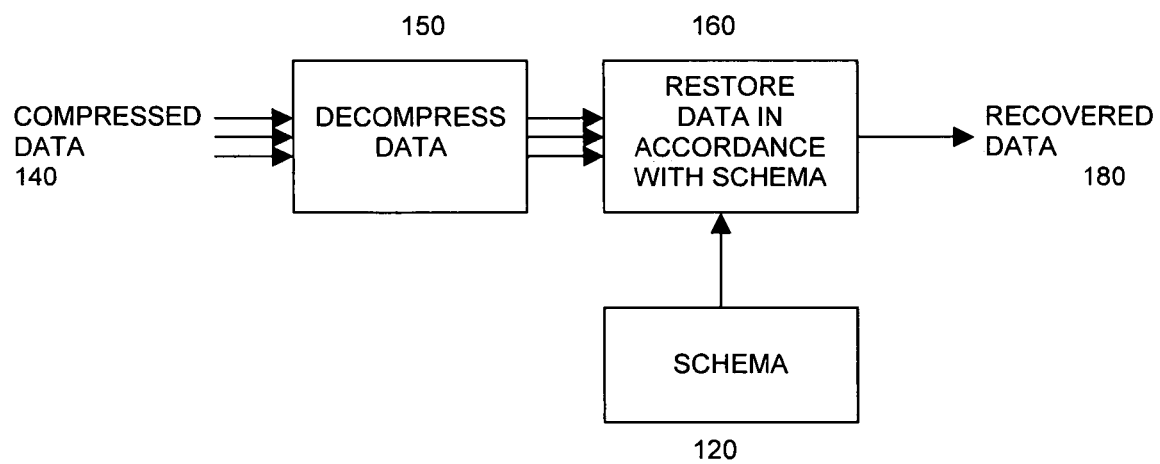

With reference to FIGS. 1A and 1B, a simple block diagram of a compression system in accordance with an embodiment of the present invention is shown. The input data can be any stream or sequence of digital data character signals that contains information in some tabular form. Data processing and communication systems conventionally process characters of the alphabets over which compression is to be effected as bytes or binary digits in a convenient code such as the ASCII format. For example, input characters may be received in the form of eight-bit bytes over an alphabet of 256 characters. The input data to be compressed should be arranged in the form of a table of information of a known or readily ascertainable geometry. This encompasses most, if not all, forms of computer information records, such as spreadsheets and database records (of both fixed and variable length) as well as the data constructs utilized in most popular programming languages. Although the units of information shall be referred to herein as "records" or as "rows" and "columns," these terms are not meant to limit the nature of present invention to the processing of traditional spreadsheet or database constructs.

In FIG. 1A, the input data 100 is processed and transformed into one or more streams of compressed data 140. The input data is initially arranged at 110 in accordance with what the inventors refer to as a "schema." The schema 120 represents coded instructions for partitioning and reordering the data in a manner that optimizes the compression of the input data. Methods for devising such a schema are provided below. After the input data is rearranged and partitioned in accordance with the schema, the resulting data streams are, either concurrently or subsequently, compressed at 130 using any of a number of known compression schemes. The compressed data signals 140 may then be stored in electronic files on some storage medium or may be transmitted to a remote location for decoding/decompression. FIG. 1B demonstrates the corresponding decompression of the compressed data 140 into a copy of the input data 180. The compressed data is first decompressed at 150 using the analogue to whatever compression method was utilized at 130. The resulting data is then reordered and combined using the schema 120 to recreate the input data at 180.

The particular compression method used at 130 (and the corresponding decompression method at 150) does not matter for purposes of the present invention, although the particular method utilized will affect the nature of the schema used to optimize the compression results. The inventors have performed experiments with the gzip compression method, described above, although a richer set of compression methods may also be used, such as vdelta, Huffman coding, run-length encoding, etc.

The results will depend on the schema chosen for transforming the data prior to compression. The present invention emanates from the recognition that data prior to compression is often presented in a form that is suboptimal for conventional compression techniques. Transforming the data prior to compression is a method not unsimilar to that of taking a log before performing linear regression. Data compression, like linear regression, is a practical—but imperfect—modeling tool. Transforms make it easier to capture the generalizations of interest, while making it less likely that the tool will be misled by irrelevant noise, outliers, higher order interactions, and so on. The entropy of a data set, which Shannon demonstrated was the space required by the best possible encoding scheme, does not depend on the enumeration order or any other invertible transform. Nevertheless, in accordance with the present invention, such transforms can make a significant difference for most practical coders/predictors.

The invention has the advantage that existing data interfaces can be preserved by embedding data transformations within the compressor. Applications can deal with the schema unchanged, while the compressor can deal with transformed data that better suits its algorithms. With improved compression rates a good implementation can trade the extra time spent transforming data against the IO time saved by moving less data.

A schema transform that is especially useful for most tabular data files is transposing data originally in row major order into columns of fields that are compressed separately. Data files containing tables of records, such as the following simple example from The Awk Programming Language, Alfred V. Aho, Brian W. Kernighan, Peter J. Weinberger, Addison Wesley, 1988, are often stored in row major order.

| Name | Rate | Hours |
|------|------|-------|
| Beth | 4.00 | 0 |
| Dan | 3.75 | 0 |
| Kathy | 4.00 | 10 |
| Mark | 5.00 | 20 |

-continued

| Name | Rate | Hours |
|------|------|-------|
| Mary | 5.50 | 22 |
| Susie | 4.25 | 18 |

As a further example, the following C code outputs a series of employee records in row major order:

```
struct employee {
    char name[30];
    int age;
    int salary; }
    employees[1000];
fwrite(employees, sizeof(employees), 1, stdout)
```

The result is that the employee names, ages, and salaries are interleaved in the data stream but the records themselves are sequential. Row major order is extremely common and is favored by nearly all commercial databases including those offered by Informix, Oracle, and Sybase.

Row major order, however, is often suboptimal for compression purposes. In fact, the inventors have determined that, as a general rule of thumb, it is better to compress two columns of fields separately when the columns contain data that is independent. Consider the following example. Let X be a sequence of a million bits, $N=2^{20}$, generated by a binomial process with a probability of $P_X$. Let Y be another sequence of N bits, generated by the same process, but with a parameter $P_Y$. The question is whether X and Y should be compressed separately or whether they should be combined, for example by interleaving the data into row major order and compressing the columns together. Using $P_X=0.5$ and $P_Y=0$ in a monte carlo experiment with the gzip compressor, the inventors found that gzip required approximately 1.0003 bits per symbol to store X and 0.0012 bits per symbol to store Y. The combined space required by gzip of 1.0015 bits per symbol is close to the true entropy of the sets, namely $$H(X) = -0.5 \log_2(0.5) - 0.5 \log_2(0.5) = 1 \text{ bit per symbol}$$

$$H(Y) = -0 \log_2(0) - 1 \log_2(1) = 0 \text{ bits per symbol}$$

This is a good (but not perfect) compression result. However, when X and Y are interleaved, as they would be if they were in row major order, gzip requires approximately 1.44 bits per symbol—which is worse than column major order. This result is reversed if there is an obvious dependency between X and Y, e.g. where X is as above but Y mirrors the bits of X with a probability of $P_Y$ and will be the logical negation of X with a probability of $1-P_Y$. Accordingly, as a general rule (with possible exceptional cases), two vectors should be combined if there is an obvious dependency; otherwise, if the two vectors are independent, compression should not be improved by combining them—and could possibly degrade. Thus, the common usage of row major order presents a practical opportunity for improvement in compression.

In order to create an optimal schema, a given space of possible schemas must be searched for the one that leads to the best compression; i.e. it is a matter of deciding which interactions in the data are important—and which are not. Compression results can be improved by searching a larger space of possible schemas. For example, different column permutations may be tried in order to take advantage of dependencies among non-adjacent columns. Transforms can be used that remove redundancies in columns by replacing values in one column with default values (nulls) if they are the same as the values in another column.

Figure 2:
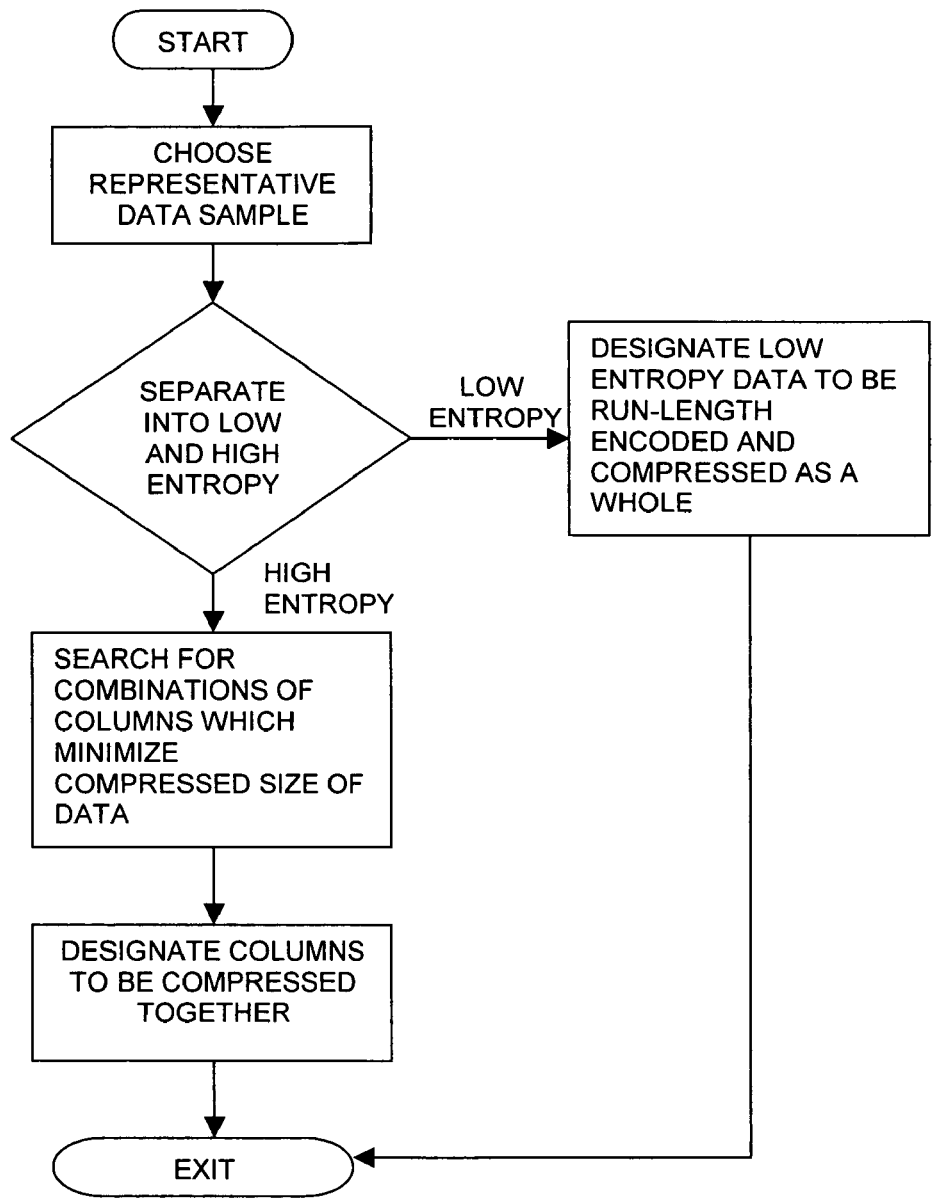
FIG. 2 is a flowchart setting forth a method of generating a schema in accordance with an embodiment of the present invention.

The generation of an optimal schema can be relegated to a machine learning task. Dynamic programming can be utilized to determine the schema that leads to the best compression, given a data sample and the space of possible schemas. In one embodiment of the present invention, an optimal schema can be generated by the method set forth in FIG. 2. A representative sample of the data to be compressed is chosen. The data is first divided into two classes: that portion which has low information content which can be dealt with as a whole and a smaller portion containing high information content which is processed further. In other words, the low entropy columns are separated from the high entropy columns, and this is accomplished by counting the rate of change of the columns and separating based on a previously chosen threshold. The low entropy columns then no longer need be included in the processing and can be designated to be run-length encoded and compressed as a whole. By handling the highly redundant data (mostly default values) separately, this not only improves the compression ratio but it can also increase the speed of compression.

The high information content data, on the other hand, can be further transformed to take advantage of both row and column dependencies. In a preferred embodiment of the invention, the high entropy data is fed to a dynamic programming module that searches for combinations of columns which minimizes the compressed size of the data. This can be made more feasible by a preprocessing step that prunes the initial search space. An optimal ordering of the columns, for example, can be generated in a bottom-up fashion by an initial transformation $\Pi$. This $\Pi$-transformed training data is used to build a matrix containing the sizes of the compressed subintervals of the training data. This matrix is used to dynamically generate the optimal partition of the schema.

Accordingly, let the number of high entropy columns chosen be n. Let P be a sequence of intervals, denoted as a set of endpoints $P=(i_1, i_2 \ldots i_p))$ such that $i_1 < i_2 < \ldots < i_p = n$. Each $i_j$ is the end of one interval, i.e. interval 1 is columns 1 through $i_1$, interval 2 is columns $i_1+1$ through $i_2$, etc. Let $\tilde{H}_G$ be a n×n matrix where each cell contains the size after compressing the interval from i to j of the $\Pi$-transformed data after compression. That is, for $1 \leq i \leq j \leq n$, let $\tilde{H}_G[i,j]$ be the size of columns i through j after compression. The task is to find the schema such that compression of the fields minimizes space. Consider any j and the two subpartitions $$P_1 = (i_1, \ldots, i_j) \text{ and } P_2 = (i_j+1, \ldots i_p)$$

If P is optimal, it follows that $P_1$ is an optimal partition of columns 1 through $i_j$ and $P_2$ is an optimal partition of columns $i_j+1$ through $i_p$. (Otherwise it would be possible to improve upon P which would violate the principle of optimality). Therefore, the following scheme can be used to compute the cost of the optimal partition P. Let $\tilde{H}_{DP}[i,j]$ be the size after compressing using the best decomposition of columns i through j seen so far. The goal is to compute $\tilde{H}_{DP}[1,n]$ and then to compute P, the optimal partition. By the principle of optimality:

$$M[i, j] = \underset{i \leq k < j}{\text{MIN}}\{\tilde{H}_{DP}[i, k] + \tilde{H}_{DP}[k+1, j]\}$$

$$\tilde{H}_{DP}[i, j] = \min\{M[i, j], \tilde{H}_G[i, j]\}$$

where M is used as a scratch pad. This produces the optimal cross entropy for the training data. The schema with this optimal cross-entropy can be calculated by performing the additional step of saving the best partition achieved so far during the execution of the program. This is accomplished by executing the following step to populate Partition:

if $H_{DP} \equiv \text{Min}[i, j]$ then Partition$[i, j]$ = $\underset{i \leq k < j}{\text{ARGMIN}}\{\tilde{H}_{DP}[i, k] + \tilde{H}_{DP}[k+1, j]\}$ else Partition$[i, j] = j$ where ARGMIN is the result of finding k such that the compressed sizes of the subintervals partitioned by k is minimal i-j. The optimal partition can then be recursively recovered from the Partition array.

The first implementation of a partition inducer by the inventors was terribly slow. It was originally assumed that the compression routine gzip would eventually see all of the uncompressed data, only in a different order. The presence of fixed byte values in some sample data opened up other possibilities. Using run length encoding, fixed values trivially compress to a byte value and repetition count. With many fixed columns, they could be moved out of the inner program loop and noticeably improve run times. Experiments were done to determine how run length encoding performs with column values that change at a low rate from record to record. Data samples from a few AT&T systems show that the number of low frequency columns tends to increase with record size (define the "frequency" of a column to be the percentage of record to record value changes for the column with respect to the total number of records sampled: a frequency of 0 means the common value is fixed; a frequency of 100 means the column value changes with each record). This is because many long record schemas are typed, with each type populating a different set of fields. If the typed records cluster in any way than the number of low frequency columns naturally increases. Run length encoding can be inefficient, though, if there is correlation between two low frequency columns. For example, if two column values always change at the same time, then run length encoding ends up duplicating the run length count. A difference encoding (DIFE) was found by the inventors to do much better when there are correlated columns. DIFE maintains a pattern record of current low frequency column values and emits a count for the number of records the pattern repeats. It then emits a sequence of <column-number+1, byte-value> pairs, terminated by <0>, that modify the pattern record. This is followed by more repeat count and byte-value groups, and continues until a 0 repeat count is emitted after the last record. For example, the DIFE encoding for the 5 byte fixed record data set forth in FIG. 3A is the compressed data set forth in FIG. 3B. Experimental data shows that DIFE preprocessing before gzip uses less space than gzip alone for columns with frequency $\leq 10\%$. Although DIFE was formulated to decrease the load on the inner loop, which it did, it also boosted the compression rates for most of the data tested.

FIG. 4 sets forth an initial compression design of an implementation of the present invention which the inventors have called "PZIP." PZIP was built on top of the SFIO IO library, as described in D. G. Korn and K. P. Vo, SFIO: Safe/Fast String/File IO, Proc. of Summer '91 USENIX Conf. in Nashville, Tenn., 1991. Sfio provides an interface similar to the UNIX stdio, but also supports user discipline functions that can access IO buffers both before and after read and write operations. A gzip sfio discipline "sfdcgzip" was implemented using the zlib read and write routines. The call sfdcgzip(op, SFGZ_NOCRC);

pushes the gzip discipline with crc32 ( ) disabled on the output stream op and all data written to op is compressed via zlib. The discipline also intercepts sfio output flush calls (i.e. sfsync (op);) and translates these to zlib full table flush calls. This greatly simplified the pzip compressor coding. Debugging was done by omitting the sfdcgzip ( ) call; the full working version simply enabled the call again. A portion of the compressor code in FIG. 5 sets forth the ease of this approach. A speed increase was achieved by modifying the zlib routines to allow crc32 ( ) checking to be disabled, and PZIP was modified to disable it by default. The crc32 ( ) routine was found by the inventors to account for over 20% of the run time. It turns out that the checksum is computed on the uncompressed data, so the percentage of time spent in crc32 ( ) increases with the compression rate. Since PZIP embeds partition counts throughout its data and has enough information to count to the last byte, crc32 ( ) was seen as overkill, especially since the disk and memory hardware on most modern systems already have checksum.

The PZIP data layout is illustrated in FIG. 7. The compressor arranges the data for fast decompression: each window contains the high frequency data first, then the DIFE low frequency data. The number of records per window may vary but never exceeds the maximum. This way the decompressor can preallocate all internal buffer space before reading the first window. Migration from gzip to PZIP is simplified by the fact that when PZIP uncompress encounters a gzip file without PZIP headers (pzip data is eventually passed to gzip, so PZIP files can identify themselves as gzip compressed data) it simply copies the compressed data with no further interpretation. Thus a project could convert to PZIP compression and still access old gzip data. Old data can be converted from gzip to PZIP during off hours (to regain space) while newly arrived data can be directed PZIPped.

As for decompression, the most decompression time is spent in the submatrix inner loop. The loop can be sped up by combining the low frequency DIFE decoding with the high frequency partition matrix reassembly. The high frequency submatrices for a single window are laid out end to end in a contiguous buffer buf. The inner loop selects column values from buf to reassemble records and write them to the output stream. Conditionals slow down tight inner loops. Tables computed before the inner loop can eliminate some conditionals. PZIP uses two tables to eliminate all but the loop termination conditional. These are the pointer array mix [i ] that points to the first value for column i in buf, and the integer array inc [i ], that when added to mix [i], points to the next value for column i. In the following inner loop code, pat is the current low frequency pattern buffer, the same size as the record size. High frequency columns in the pattern buffer are initialized to a default value. This allows each reassembled output record to be initialized by a single memcpy ( ), which would be much more efficient than separate memcpy ( ) calls for each contiguous low frequency column range, especially considering that 90% of the columns are usually low frequency. A final data optimization separates the DIFE repetition counts and column offsets from the changed column values so they can be gzip compressed with different tables. The low frequency column values are placed in the buffer val. See FIG. 6. Decompression can be sped up if only a portion of the high frequency columns are required; this happens often when only a few fields are present in a data query. In this case high_freq_cols can be set to the required number of high frequency columns, and mix and inc can be precomputed according to this lower number.

PZIP induces partitions using a separate program which the inventors have named "PIN." PIN takes as input a 4 Mb window of training data (a sample of the actual data) and the fixed record size n. It implements a dynamic program, as described above, and, using gzip as a compressor to test compression rates, produces an optimal partition and corresponding compression rate for the training data. The partition is written to a file with the following syntax: the first line is the fixed record size; each remaining line describes one class in the induced schema partition. A class description is a space-separated list of the column positions in the class counting from 0, where i-j is shorthand for the column positions i through j inclusive. The partition file is simply a list of record byte position groups that, for the purposes of PZIP, correspond to the byte columns that should be compressed separately. See FIG. 8 for an example of such a partition file.

To handle data of all sizes, PZIP must operate on one section, or window, at a time. Window size affects both compression and decompression performance. At some point the PZIP compressor must perform submatrix transformations to prepare the partitions for gzip, and a similar operation does the inverse for decompression. This means a buffer to buffer copy, with linear access to one and random access to the other. Random buffer access can be expensive on some systems. Most virtual memory computers provide levels of increasingly slower memory access: local cache, ~10-100 Kb, local memory, ~1-4 Mb, and shared memory, >4 Mb. The access time difference between levels can be up to an order of magnitude on some systems. Timing experiments show that 4 Mb is a reasonable compromise for the inventor's local machines (SGI, Sun, Alpha, and Intel). There are valid concerns for basing the calculations on such a small, localized amount of data, especially since many systems using PZIP could deal with multiple gigabytes of new data each day. Some form of sampling over a large span of records might be preferable. But localized record correlations are exactly what PZIP exploits. A partition group with the same value from record to record is the best possible situation for PZIP.

The implementation of PIN is divided into four steps. The first step reads the training data window, computes the column frequencies, and generates a submatrix from the high frequency columns. The next step determines a permutation of the column positions from which an optimal partition will be determined. An optimal solution to this step is NP-complete, so a suboptimal heuristic search is done. Let the matrix $$T = \begin{bmatrix} t_{11} & \cdots & \cdots & t_{1n} \\ \vdots & \cdots & \cdots & \vdots \\ \vdots & \cdots & \cdots & \vdots \\ t_{m1} & \cdots & \cdots & t_{mn} \end{bmatrix}$$

represent the training data with m rows (the number of records) and n columns (the fixed record length), where $t_{ij}$ is byte j of record i, and $|T|=mn$. A compressor $\zeta$ applied to T, $\zeta(T)$, reads the elements of T in row major order and produces a byte vector with $|\zeta(T)|$ elements and a compression rate of $$\frac{|T|}{|\zeta(T)|}.$$

Let $T_{p,q}$ be the submatrix of T consisting of columns p through q inclusive $$T_{p,q} = \begin{bmatrix} t_{1p} & \cdots & \cdots & t_{1q} \\ \vdots & \cdots & \cdots & \vdots \\ \vdots & \cdots & \cdots & \vdots \\ t_{mp} & \cdots & \cdots & t_{mq} \end{bmatrix}$$

The search starts by computing $|\zeta(T_{\{i,j\}})|$ for all high frequency column pairs, where $T_{\{i,j\}}$ is the submatrix formed by columns i and j. All columns x for which $|\zeta(T_{\{x\}})| \leq \min(|\zeta(T_{\{x,i\}})|, |\zeta(T_{\{i,x\}})|)$ are placed in singleton partition classes and are not considered further in this step. Notice that both $T_{\{x,i\}}$ and $T_{\{i,x\}}$ are to be tested. This is because the gzip matching and encoding algorithm is biased by its scan direction. The size difference is not much per pair, but could amount to a byte or so per compressed record when all columns are considered. The remaining pairs are sorted by $|\zeta(T_{\{i,j\}})|$ from lowest to highest, and a partition is formed from the singletons and the lowest size pairs, possibly splitting a pair to fill out the partition. Next the classes are expanded, starting from the smallest (compressed) size. A class is expanded by selecting in order columns from the remaining classes, and keeping the one that minimizes the sizes of the two new classes (the one expanded and the one reduced by the donated column), if any. A column is added by checking the compressed size of the class for all positions within the class, e.g., $|\zeta(T_{\{x,i,\ldots,j\}})|$ through $|\zeta(T_{\{i,\ldots,j,x\}})|$. Once a class is expanded it is not considered again, for expansion or for contribution to another class, until all the remaining classes have been considered for expansion. This process continues until there are no more expansions, and produces a column permutation, i.e., the columns in the heuristic partition classes taken in order, for the next step. The final step determines an optimal partition on the permutation produced by the heuristic search using the dynamic program described above: namely, an optimal partition of T for a given permutation has p classes of column ranges $i_k$, $j_k$ that minimize:

$$\sum_{k=1}^{p} |\zeta(T_{i_k,j_k})|$$

subject to:
$i_1 = 1$
$i_k \leq j_k$
$i_k = j_{k-1} + 1$
$j_p = n$ where the conditions ensure that each column is a member of exactly one class. This is a linear program and can be solved by dynamic programming in $O(n^3)$ time.

PIN benefits from the removal of low frequency columns since they can be ignored when inducing an optimal partition. For example, a project with 781 byte records had only 81 columns with frequency greater than 10%. This reduces the 4 Mb window PIN run times form 8 hours on an SGI Challenge to under 10 minutes on an Intel Pentium II personal computer.

Moreover, an unexpected discovery came out of the timing analysis. The gzip command provides levels of compression ranging from 0 (best time, worst space) to 9 (worst time, best space), the default level being 9. It turns out that the zlib default level is 6. When this was discovered PZIP was immediately run with level 9, and the result was little or no compression improvement, and much worse run time. So data partitioning has the added benefit of being able to run gzip at a lower compression level, saving time at little cost to space.

FIG. 8 illustrates the format of an induced schema utilized by the inventors in experiments on compressing telephone call detail records. The records each have a length of 752 bytes. The first line of the schema has been utilized to specify the size of the record and can be used to validate the input data. Each subsequent line, denoted field1, field2, etc., represents and identifies portions of each data record that should be extracted and compressed separately. For example, field 5 indicates that the bytes at position 331 and 330 out of the 752 bytes in each record should be taken and compressed together separately from the rest of the data file. Approximately 10% of the 752 bytes of each record are set forth as separate fields for compression; the rest are processed as a unit (designated implicitly as field 18). The induced schema, generated by the above process, looks similar to a standard database schema, but there are interesting differences. The induced schema emphasize what is probable over what is possible. For example, telephone number records are usually 10 digits long, but there are some exceptional international numbers that can consume up to 16 digits. A database schema for such records would usually need to allocate 16 bytes in all cases to accommodate these exceptions, but the induced schema of the present invention tends to split the telephone numbers into two fields, a 10 digit column for the general case, and a 6 digit column for the exceptions.

This subtle reshuffling of the data can have a dramatic effect on the results of even a suboptimal compression scheme such as gzip. Experiments conducted by the inventors on telephone call detail have yielded compression ratios of 30:1, in comparison to compression ratios of 14-15:1 when the data is left in row major order (and 16-18:1 when the data is merely transformed into column major order). Significant improvement can be had with other applications, although the worst case for the present invention would be a random table, i.e. a table whose shortest description is itself. In that case, no improvement is possible.

One might think that reordering the data into columns might cost extra time since the output clear text is in row major order. In fact, the inventors have found that rearranging the data into columns can result in faster compression times. It is believed that the time to rearrange the columns is relatively small compared with the times for encoding/decoding and disk input/output. Accordingly, the present invention results in an improvement in both these bottlenecks to quick compression, an improvement which can more than offset the time for rearranging the columns. It is notable that if one often poses queries to the database that require only a few fields containing high entropy columns, the decoding time can be further dramatically improved by decompressing only the columns of interest.

Moreover, although the techniques could be utilized for variable length record data, the present invention highlights certain advantages fixed length record data may have over variable length record data. Fixed length record data is often viewed as a waste of space, too sparse for production use. Much effort is then put into optimizing the data schema, and in the process complicating the data interface. PZIP shows that in many cases this view of fixed length data is wrong. In fact, variable length data may become more compressible when converted to a sparse, fixed length format. Intense semantic schema analysis can be replaced by an automated record partition, resulting in compression space improvements of 2 to 10 times and decompression speed improvements of 2 to 3 times over gzip for a large class of data.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention.

What is claimed is:

1. An apparatus for improved compression of a stream of data comprising:
    means for transforming the data in accordance with a schema to form a first portion and a second portion; and
    means for compressing the first portion separately and for separately compressing the second portion,
    wherein the transforming means comprises means for reordering the data into column major order.

2. The apparatus of claim 1 wherein the transforming means comprises means for partitioning the data into columns which are separately compressed.

* * * * *